US008941429B2

(12) United States Patent
Cheng

(10) Patent No.: US 8,941,429 B2
(45) Date of Patent: Jan. 27, 2015

(54) MASTER-SLAVE FLIP-FLOP WITH LOW POWER CONSUMPTION

(71) Applicant: Zhihong Cheng, Suzhou (CN)

(72) Inventor: Zhihong Cheng, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/959,745

(22) Filed: Aug. 6, 2013

(65) Prior Publication Data

US 2014/0240017 A1 Aug. 28, 2014

(30) Foreign Application Priority Data

Feb. 26, 2013 (CN) .......................... 2013 1 0140547

(51) Int. Cl.
*H03K 3/356* (2006.01)
*H03K 3/012* (2006.01)
*H03K 3/3562* (2006.01)

(52) U.S. Cl.
CPC ............ *H03K 3/012* (2013.01); *H03K 3/35625* (2013.01)
USPC ............ 327/203; 327/208; 327/210; 327/218

(58) Field of Classification Search
USPC ......... 327/199, 202, 203, 208, 210–212, 214, 327/215, 218, 219
See application file for complete search history.

(56) References Cited

U.S. PATENT DOCUMENTS

| 6,828,837 | B2 | 12/2004 | Ahn |
| 7,405,606 | B2 | 7/2008 | Kok et al. |
| 7,868,677 | B2 | 1/2011 | Jain |
| 2011/0095799 | A1 | 4/2011 | Ramaraju |
| 2013/0147534 | A1* | 6/2013 | Cheng et al. ................. 327/202 |

FOREIGN PATENT DOCUMENTS

JP            2004064557 A    *   2/2004

OTHER PUBLICATIONS

Mototsugu Hamada, et al., "A Conditional Clocking Flip-Flop for Low Power H.264/MPEG-4 Audio/Visual Codec LSI", IEEE Custom Integrated Circuits Conference 2005, p. 527.

* cited by examiner

*Primary Examiner* — Long Nguyen
(74) *Attorney, Agent, or Firm* — Charles Bergere

(57) ABSTRACT

In a master-slave flip-flop, the master latch has first and second three-state stages, and a first feedback stage. The slave latch has third and fourth three-state stages, and a second feedback stage. First and second clock switches having opposite phases are provided. The first clock switch is configured in one of the first and fourth three-state stages, and the other stage shares the first clock switch. The second clock switch is configured in one of the second and third three-state stages, and the other stage shares the second clock switch. The second three-state stage has an additional pair of complementary devices having signal paths connected in series with each other with both being gated by a data output of the slave latch. The flip-flop reduces the number of clock switches and clock switch power consumption.

16 Claims, 4 Drawing Sheets

MASTER-SLAVE FLIP-FLOP WITH LOW POWER CONSUMPTION

CROSS-REFERENCE TO RELATED APPLICATIONS

This application is related to pending U.S. patent application Ser. No. 13/605,984 filed Sep. 6, 2012, assigned to Freescale Semiconductor, Inc.

BACKGROUND OF THE INVENTION

The present invention is directed to a digital logic circuit and, more particularly, to a master-slave flip-flop with low power consumption.

Master-slave flip-flops are widely used in digital logic circuits. Typically a master-slave D flip-flop has two gated latches connected in series and driven by a two-phase clock signal. The master latch registers the value of the input signal at the trailing edge of a first phase of the clock signal, which is the active clock edge for the master latch. The slave latch registers the value of the output signal from the master latch at the trailing edge of the following, opposite phase of the clock signal, which is the active clock edge for the slave latch.

Since a large number of flip-flops may be used in a typical integrated circuit (IC), the power consumption of the flip-flops can be significant. Various techniques have been used to reduce this power consumption. However, most of these techniques have the disadvantages of increasing circuit area and/or leading to performance penalties such as increased set-up or hold times, clock glitches and risk of unstable operation.

Thus, it would be advantageous to be able to reduce power consumption of flip-flops in an IC while avoiding some or all of these disadvantages.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF PREFERRED EMBODIMENTS OF THE INVENTION

Figure 1:
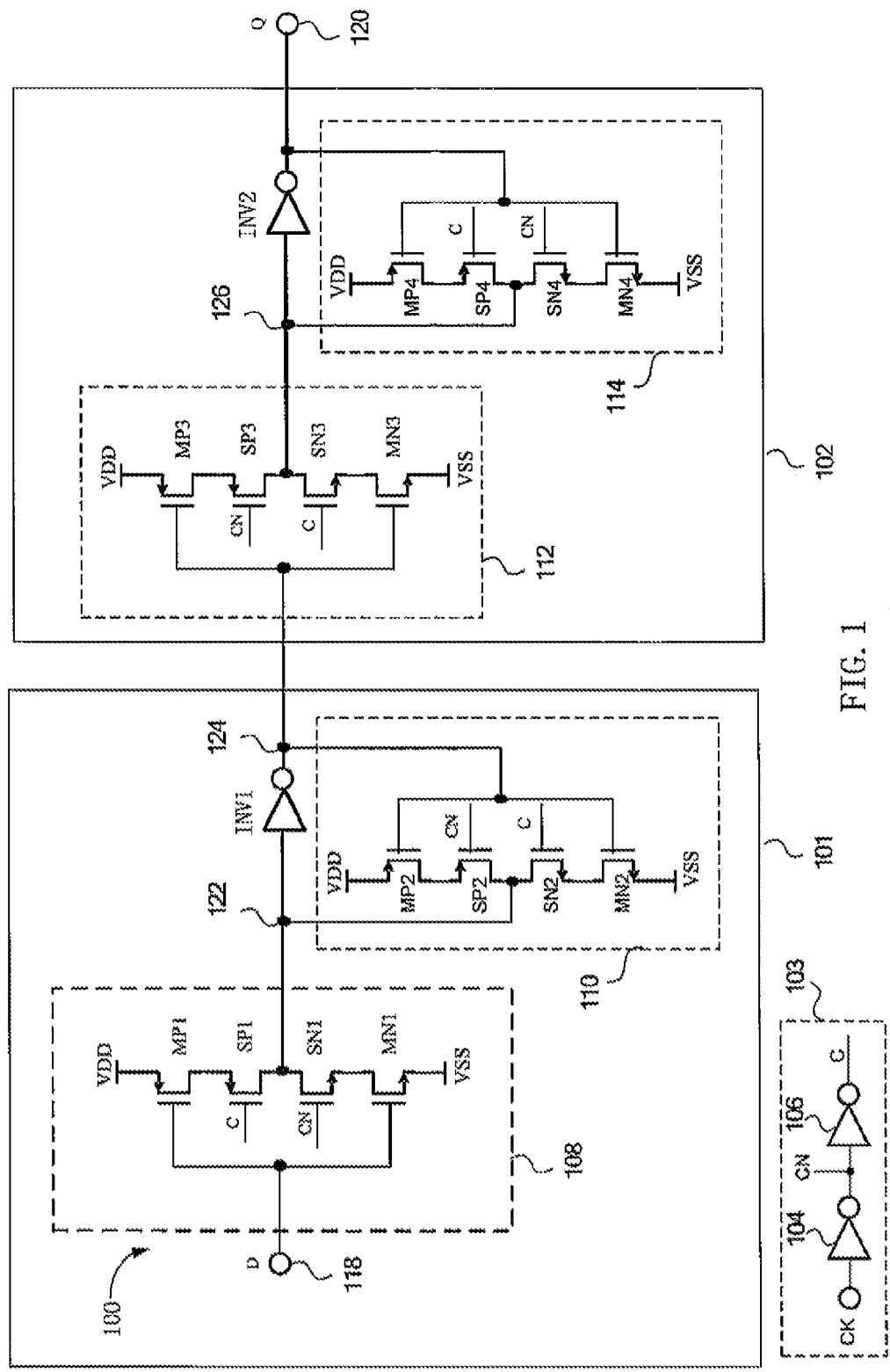
FIG. 1 is a schematic circuit diagram of a known master-slave D flip-flop.

The following examples of flip-flops are described with positive voltage signals corresponding to asserted, logically true values and zero voltage signals corresponding to de-asserted, logically false values. However, it will be appreciated that the flip-flops described may be adapted to zero (or negative) voltage signals corresponding to asserted, logically true values and positive voltage signals corresponding to de-asserted, logically false values. Further, specific conductivity types or polarity of potentials have been described in the examples but it will be appreciated that the examples may be adapted to opposite conductivity types and polarities FIG. 1 illustrates a known master-slave D flip-flop 100 including a master latch 101 and a slave latch 102. A clock source 103 receives a system clock signal CK and includes a pair of inverters 104 and 106 connected in series to generate an opposite phase clock signal CN and an in-phase clock signal C from the system clock signal CK and supplies the clock signals C and CN to the flip-flop 100.

The master latch 101 has first and second three-state stages 108 and 110 having respective data inputs, data outputs, and clock switches, and a first feedback stage INV1 for positive feedback from the data outputs of the first and second three-state stages 108 and 110 to the data input of the second three-state stage 110. The clock switches of the first three-state stage 108 and the second three-state stage 110 have opposite phases.

Similarly, the slave latch 102 includes third and fourth three-state stages 112 and 114 having respective data inputs, data outputs, and clock switches, and a second feedback stage INV2 for positive feedback from the data outputs of the third and fourth three-state stages 112 and 114 to the data input of the fourth three-state stage 114. The clock switches of the third three-state stage 112 and the fourth three-state stage 114 have opposite phases.

In operation, the data input of the first three-state stage 108 receives data input signals from an input terminal 118. The data input of the third three-state stage 112 receives data signals from the output of the first feedback stage INV1, which is an output of the master latch 101. The output signal Q of the slave latch 102, which is an output of the flip-flop 100, appears at an output terminal 120 of the second feedback stage INV2.

More specifically, the three-state stages 108, 110, 112 and 114 are inverter stages and the first and second feedback stages are also inverters. The first three-state stage 108 includes a pair of data inverter elements having p-type and n-type complementary metal-oxide-semiconductor (CMOS) devices MP1 and MN1, having signal paths connected to high and low voltage power supplies $V_{DD}$ and $V_{SS}$ and control electrodes (gates) connected to receive the data input signals of the first three-state stage 108. The first clock switch of the first three-state stage 108 includes a pair of clock switch elements SP1-SN1, designed as p-type and n-type CMOS devices having signal paths connected in series with each other and in series with the signal paths of the data inverter element devices MP1-MN1. The clock switch element SP1 receives the clock signal C on its control electrode, whereas the clock switch element SN1 receives the opposite phase clock signal CN on its control electrode. Similarly, the other three-state inverter stages 110, 112 and 114 respectively include a pair of data inverter elements having p-type and n-type CMOS devices MP2-MN2, MP3-MN3, and MP4-MN4, having signal paths connected to the high and low voltage power supplies $V_{DD}$ and $V_{SS}$ and control electrodes connected to receive the respective data input signals of the three-state inverter stages 110, 112 and 114. The clock switches of the three-state inverter stages 110, 112 and 114 respectively include pairs of clock switch elements SP2-SN2, SP3-SN3, and SP4-SN4, designed as p-type and n-type CMOS devices having signal paths connected in series with each other and in series with the signal paths of the data inverter element devices MP2-MN2, MP3-MN3, and MP4-MN4. The clock switch elements SN2, SN3 and SP4 receive the clock signal C on their control electrodes, whereas the clock switch elements SP2, SP3 and SN4 receive the opposite phase clock signal CN on their control electrodes.

The data signal outputs of the first and fourth three-state stages 108 and 114 are functions of their respective data inputs when the clock signals C and CN are respectively de-asserted and asserted. Specifically, the first and fourth three-state stages 108 and 114 are OFF (high impedance data signal outputs) when the clock signals C and CN are respectively asserted and de-asserted. While, the data signal outputs of the second and third three-state stages 110 and 112 are functions of their respective data inputs when the clock signals C and CN are respectively asserted and de-asserted. That is, the second and third three-state stages 110 and 112 are OFF (high impedance data signal outputs) when the clock signals C and CN are respectively de-asserted and asserted.

The output signals of the first and second three-state stages 108 and 110 appear at a node 122 connected to the signal paths of the first clock switch including SP1-SN1, the second clock switch including SP2-SN2, and to the input of the first feedback inverter INV1. The data inputs of the third three-state stage 112 are provided by the output signal of the first feedback inverter INV1 at a node 124. The output signals of the third and fourth three-state stages 112 and 114 appear at a node 126 connected to the signal paths of the third clock switch including SP3-SN3 and the fourth clock switch including SP4-SN4 and to the input of the second inverter INV2. The output Q at the output of the slave latch 102 and of the D flip-flop 100 at the output terminal 120 is applied to the control electrodes of the data inverter element devices MP4-MN4 to provide the positive feedback of the fourth three-state stage 114.

Known approaches to reduce power consumption of a D flip-flop of the kind shown in FIG. 1 tend to be inefficient, and result in more complicated design flow, increased design cycle time and increased die size, often with limited power reduction.

Persons skilled in the art understand that clock signal switching inherently is usually much more frequent than data signal switching and typically accounts for a larger proportion of the power consumption than data signal switching. That is, if the number of clock switches in a flip-flop decreases, the power consumption of the flip-flop will decrease correspondingly. For the D flip-flop shown in FIG. 1, since the first and fourth clock switches have the same clock signal inputs and clock phase, and the second and third clock switches have the same clock signal inputs and same clock phase, it is desirable that the first and fourth three-state stages share a clock switch, and the second and third three-state stages can share a clock switch, such that the number of clock switches in the flip-flop is reduced. However, in such case, logic conflicts can easily occur.

Figure 2:
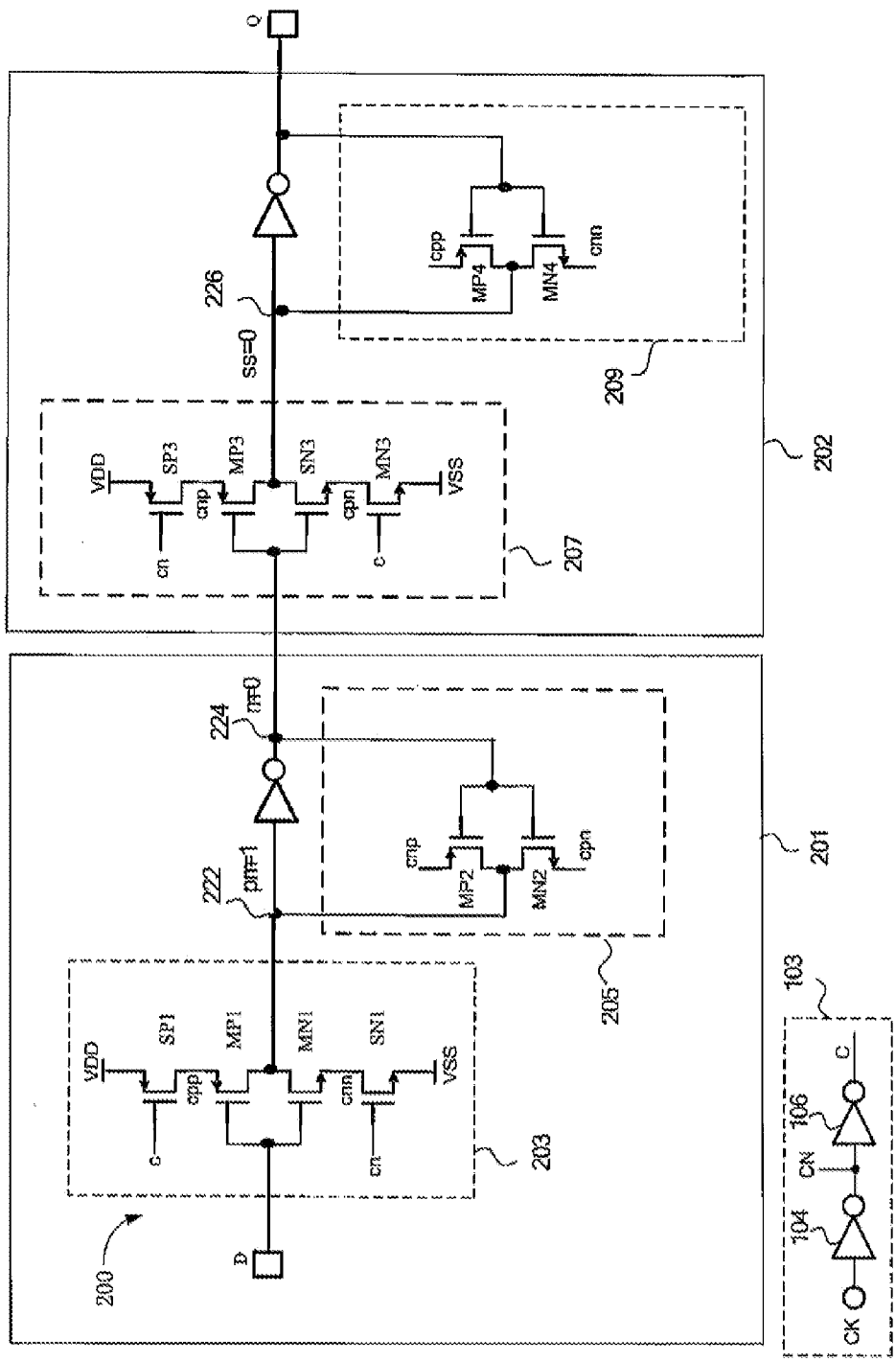
FIG. 2 is a schematic circuit diagram illustrating a known flip-flop circuit where two clock switches are shared among four three-state stages, which causes logic contention.

FIG. 2 illustrates an example of a flip-flop 200 having a master latch 201 and a slave latch 202 as described above except a first three-state stage 203 of the master latch 201 and a fourth three-state stage 209 of the slave latch 202 share a first clock switch, and a second three-state stage 205 of the master latch 201 and a third three-state stage 207 of the slave latch 202 share a second clock switch.

As shown in FIG. 2, the first clock switch including SP1 and SN1 is designed in the first three-state stage 203, and the fourth three-state stage 209 shares the first clock switch through nodes "cpp" and "cnn" such that the clock switch elements SP4 and SN4 shown in FIG. 1 may be eliminated. The second clock switch including SP3 and SN3 is designed in the third three-state stage 207, and the second three-state stage 205 shares the second clock switch through nodes "cnp" and "cpn" such that the clock switch elements SP2 and SN2 as shown in FIG. 1 also may be eliminated. However, logic contention will occur between a node 222 in the master latch 201 and a node 226 in the slave latch 202 when the value at the node 222 is different form that at the node 226. Assuming the first clock switch including SP1/SN1 is on, the second clock switch including SP3/SN3 is off, and the logic values "pm" at node 222, "m" at node 224, and "ss" at node 226 are "1", "0", and "0" respectively, since both the data elements MP2 and MP3 are on, the node 222 will be connected to node 226 via MP2, node "cnp" and MP3. In another case, assuming "pm" at node 222, "m" at node 224, and "ss" at node 226 are "0", "1", and "1" respectively, since both the data elements MN2 and MN3 are on, the node 222 will be connected to node 226 via MN2, node "cpn" and MN3. Since they have different logic values, logic contention occurs and thus, the flip-flop 200 cannot operate normally. Therefore, when trying to reduce the number of clock switches in a flip-flop, such logic contention issues must be considered.

Flip-flops according to embodiments of the invention solve the above technical problem. In an embodiment of the invention, a flip-flop comprises a master latch and a slave latch. The master latch has first and second three-state stages respectively having a first pair of complementary semiconductor devices gated by a data input of the first three-state stage and a second pair of complementary semiconductor devices gated by a data input of the second three-state stage, and a first feedback stage for positive feedback from data outputs of the first and second three-state stages to the second three-state stage's data input. The slave latch is connected to the master latch, and has third and fourth three-state stages. The third and fourth three-state stages respectively have a third pair of complementary semiconductor devices gated by a data input of the third three-state stage and a fourth pair of complementary semiconductor devices gated by a data input of the fourth three-state stage, and a second feedback stage for positive feedback from data outputs of the third and fourth three-state stages to the fourth three-state stage's data input. The flip-flop further comprises first and second clock switches having opposite phases, receiving clock signals from a clock signal source. The first clock switch is configured in one of the first and fourth three-state stages, and the other three-state stage shares the first clock switch. The second clock switch is configured in one of the second and third three-state stage, and the other three-state stage shares the second clock switch. The second three-state stage further includes an additional pair of complementary semiconductor devices having signal paths connected in series with each other and both gated by a data output of the slave latch.

In an embodiment of the invention, the first, second, third and fourth pairs of complementary semiconductor devices have respective signal paths connected in series with each other and in series with the first or second clock switch. The additional pair of complementary semiconductor devices has signal paths connected in series with the second pair of complementary semiconductor devices. Positions of a PMOS of the second pair of complementary semiconductor devices and that of the additional pair of complementary semiconductor devices are exchangeable, and positions of a NMOS of the second pair of complementary semiconductor devices and that of the additional pair of complementary semiconductor devices are exchangeable. The first and second clock switches are respectively connected to a power supply.

According to one embodiment of the invention, the first clock switch is configured in the first three-state stage, and the second clock switch is configured in the second three-state stage. According to one embodiment of the invention, the first clock switch is configured in the first three-state stage, and the second clock switch is configured in the third three-state stage. In another embodiment, the first clock switch is configured in the fourth three-state stage, and the second clock switch is configured in the second three-state stage. In a further embodiment of the invention, the first clock switch is configured in the fourth three-state stage, and the second clock switch is configured in the third three-state stage.

Embodiments of the invention also provide methods of operating the above described flip-flop by applying a data input signal to the first three-state stage's data input and applying a clock input signal to first and second clock switches.

Figure 3:
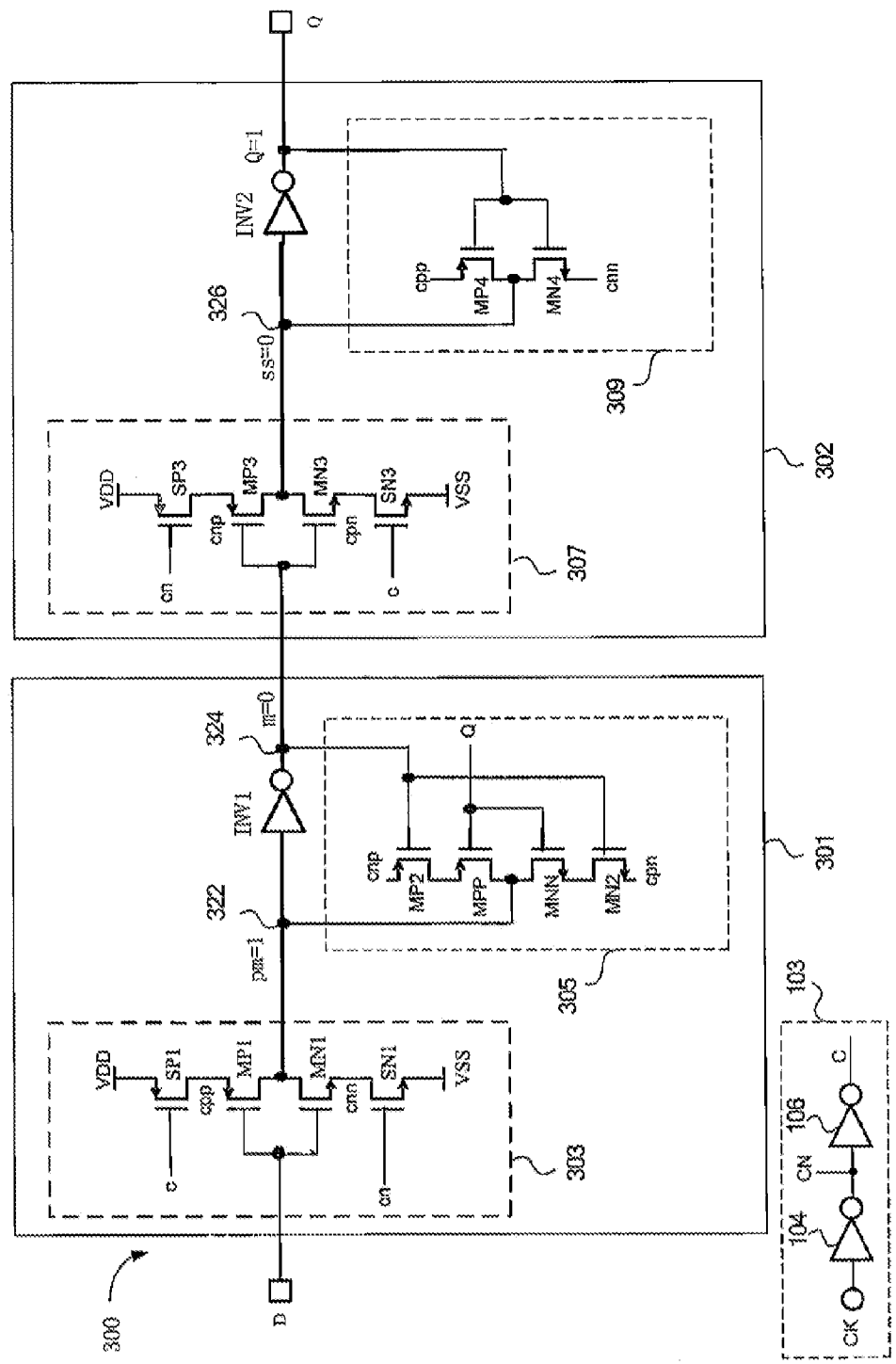
FIG. 3 is a schematic circuit diagram of a master-slave D flip-flop in accordance with one embodiment of the invention, given by way of example.

Referring now to FIG. 3, an example of a flip-flop 300 having a master latch 301 and a slave latch 302 in accordance with an embodiment of the invention is shown. In this embodiment, the flip-flop 300 is a D flip-flop. However, it will be understood by those of skill in the art that the invention can be adapted to other configurations of flip-flops. The flip-flop 300 has a reduced number of gates and wiring capacitances of clock devices, while ensuring that: (a) the flip-flop 300 has lower power consumption than the flip-flop 100, (b) the flip-flop 300 is fully static logic, since static logic is dominant, (c) the performance of the flip-flop 300 is equal to or better than the flip-flop 100, and will not cause logic contention, (d) the size of the flip-flop 300 is smaller than that of the flip-flop 100, (e) the flip-flop 300 presents less loading to the external clock tree than the flip-flop 100, and (f) the flip-flop 300 allows the use of other, additional power reduction techniques.

The master latch 301 has first and second three-state stages 303 and 305 having respective first and second data inputs, and first and second data outputs. The master latch 301 also has a first feedback stage INV1 for positive feedback from the first and second data outputs to the second data input.

The slave latch 302 has third and fourth three-state stages 307 and 309 having respective third and fourth data inputs, and third and fourth data outputs. The slave latch 302 also has a second feedback stage INV2 for positive feedback from the third and fourth data outputs to the fourth data input, as shown.

The first and fourth three-state stages 303 and 309 share a first clock switch having first clock inputs that receive clock signals from a clock signal source 103, and the second and third three-state stages 305 and 307 share a second clock switch having second clock inputs that receive clock signals from the clock signal source 103. The first and second clock switches have opposite phases. The clock source 103 receives a system clock signal CK and includes a pair of inverters 104 and 106 connected in series to generate an opposite phase clock signal CN and an in-phase clock signal C from the system clock signal CK and supplies the clock signals CN and C to the first and second clock switches.

More specifically, for the flip-flop 300, the first clock switch is configured in the first three-state stage 303, and includes a pair of clock switch elements SP1-SN1, designed as p-type and n-type CMOS devices having signal paths connected to high and low voltage power supplies $V_{DD}$ and $V_{SS}$. The clock switch element SP1 receives the clock signal C on its control electrode, whereas the clock switch element SN1 receives the opposite phase clock signal CN on its control electrode. The first three-state stage 303 further includes a pair of data inverter elements, such as p-type and n-type CMOS devices MP1 and MN1, having signal paths connected in series with each other and in series with the clock switch elements SP1 and SN1. The control electrodes (gates) of MP1 and MN1 are both connected to receive the data input signals of the first three-state stage 303. The fourth three-state stage 309 includes a pair of data inverter elements, such as p-type and n-type CMOS devices MP4 and MN4, having signal paths connected in series with each other and in series with the clock switch elements SP1 and SN1 via the nodes "cpp" and "cnn" to share the first clock switch with the first three-state stage 303. The control electrodes (gates) of MP4 and MN4 are both connected to receive the data input signals of the fourth three-state stage 309.

Similarly, the second clock switch is configured in the third three-state stage 307, and includes a pair of clock switch elements SP3-SN3, designed as p-type and n-type CMOS devices having signal paths connected to high and low voltage power supplies $V_{DD}$ and $V_{SS}$. The clock switch element SP3 receives the clock signal CN on its control electrode, whereas the clock switch element SN3 receives the opposite phase clock signal C on its control electrode. The third three-state stage 307 further includes a pair of data inverter elements, such as p-type and n-type CMOS devices MP3 and MN3, having signal paths connected in series with each other and in series with the clock switch elements SP3 and SN3. The control electrodes (gates) of MP3 and MN3 are both connected to receive the data input signals of the third three-state stage 307. The second three-state stage 305 includes a plurality of pairs of data inverter elements, such as p-type and n-type CMOS devices MP2 and MN2, and MPP and MNN having signal paths connected in series with each other and in series with the clock switch elements SP3 and SN3 via the nodes "cnp" and "cpn" to share the second clock switch with the third three-state stage 307. The control electrodes (gates) of MP2 and MN2 are both connected to receive the data input signals of the second three-state stage 305, i.e., the output of the first feedback stage INV1. The control electrodes (gates) of MPP and MNN are both connected to receive the data output signals of the slave latch 302.

The data signal outputs of the first and fourth three-state stages 303 and 309 are functions of their respective data inputs when the clock signals C and CN are respectively de-asserted and asserted. Specifically, the first and fourth three-state stages 303 and 309 are OFF (high impedance data signal outputs) when the clock signals C and CN are respectively asserted and de-asserted. While, the data signal outputs of the second and third three-state stages 305 and 307 are functions of their respective data inputs when the clock signals C and CN are respectively asserted and de-asserted. The second and third three-state stages 305 and 307 are OFF (high impedance data signal outputs) when the clock signals C and CN are respectively de-asserted and asserted.

The output signals of the first and second three-state stages 303 and 305 appear at a node 322 connected to the signal paths of the data inverter element devices MP1 and MN1 of the first three-state stage 303, MPP and MNN of the second three-state stage 305, and to the input of the first feedback inverter INV1. The data input of the third three-state stage 307 is provided by the output signal of the first feedback inverter INV1 at a node 324. The output signals of the third and fourth three-state stages 307 and 309 appear at a node 326 connected to the signal paths of the data element devices MP3 and MN3 of the third three-state stage 307, MP4 and MN4 of the fourth three-state stage 309, and to the input of the second inverter INV2. The output "Q" at the output of the slave latch 302 is applied to the control electrodes of the data inverter element devices MP4-MN4 and MPP and MNN to provide the positive feedback of the fourth three-state stage 309.

In the examples of the flip-flop 300, one of the first and fourth three-state stages 303 and 309 has a first clock switch that receives clock signals from the clock signal source 103, and the other three-state stage shares the first clock switch. At the same time, one of the second and third three-state stages 305 and 307 has a second clock switch that receives clock signals from the clock signal source 103, and the other of the three-state stages shares the second clock switch. The first and second clock switches have opposite phases. Furthermore, the second three-state stage 305 includes an additional pair of complementary semiconductor devices, such as MPP and MNN connected in series with the original pair of complementary semiconductor devices of the same three-state stage, such as MP2 and MN2, and both are gated by the data output of the slave latch 302. Sharing of clock switches between each two of the four three-state stages in this way enables a reduction in the number of clock switch elements and therefore a reduction in power consumption. For the logic contention case shown in FIG. 2, since MP2, MPP, MNN, and MN2 function as a feedback inverter when the value "pm" at the node 322 is different to the value "ss" at the node 326, the conducting path between nodes 322 and 326 is broken as a result of the different gating signals of MPP and MP2 (either MPP or MP2 are OFF) and different gating signals of MNN and MN2 (either MNN or MN2 are OFF). Then the flip-flop 300 effectively avoids the logic contention.

In other embodiments of the invention, the first and second clock switches can be configured in the other of each pair of three-state stages that share the same clock switches. As such, for the pair of first and fourth three-state stages, the first clock switch can be configured in the fourth three-state stage instead of the first three-state stage as shown in FIG. 3, and for the pair of second and third three-state stages, the second clock switch can be configured in the second three-state stage instead of the third three-state stage as shown in FIG. 3. Furthermore, persons skilled in the art will understand that the positions of MPP and MNN are exchangeable with the pair of original complementary semiconductor devices, such as MP2 and MN2. More specifically the positions of MPP and MP2 are exchangeable while the positions of MNN and MN2 are exchangeable, which will not substantially change the invention.

Figure 4:
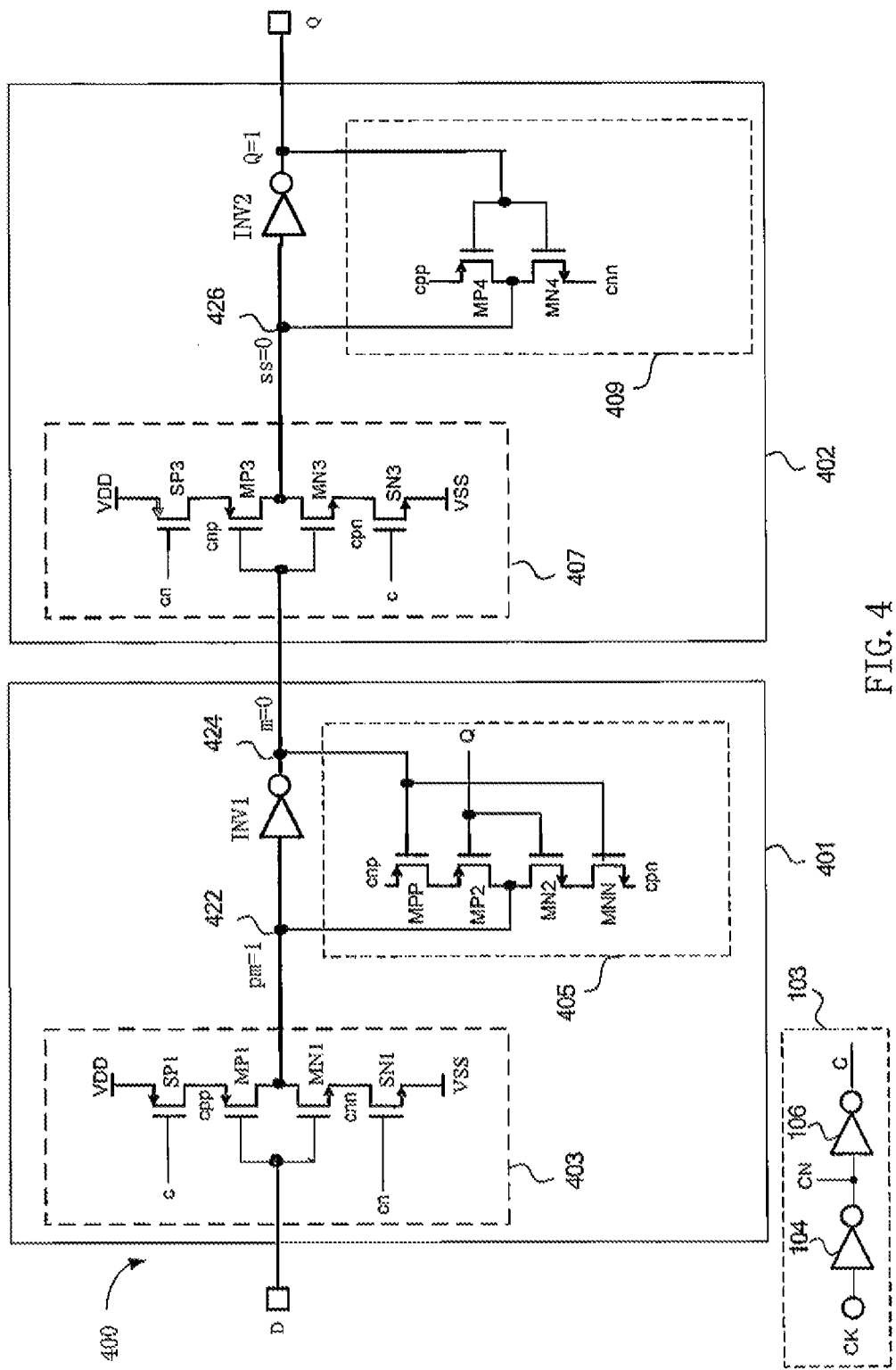
FIG. 4 is a schematic circuit diagram of a master-slave D flip-flop in accordance with another embodiment of the invention, given by way of example.

FIG. 4 illustrates an example of flip-flop 400 having a master latch 401 and a slave latch 402 in accordance with another embodiment of the invention.

In this example, the master latch 401 has first and second three-state stages 403 and 405. The slave latch 402 has third and fourth three-state stages 407 and 409. The first and fourth three-state stages 403 and 409 share a first clock switch receiving clock signals from the clock signal source 103, and the second and third three-state stages 405 and 407 share a second clock switch having clock inputs receiving clock signals from the clock signal source 103. The first and second clock switches have opposite phases.

In more detail, the first clock switch including SP1 and SN1 is configured in the first three-state stage 403. The fourth three-state stage 409 includes a pair of data inverter elements, such as p-type and n-type CMOS devices MP4 and MN4 having signal paths connected in series with each other and in series with the clock switch elements SP1 and SN1 via the nodes "cpp" and "cnn" to share the first clock switch with the first clock switch. The control electrodes (gates) of MP4 and MN4 are both connected to receive the data input signals of the fourth three-state stage 409. That is, MP4 and MN4 are gated by the data input of the fourth three-state stage 409. Similarly, the second clock switch including SP3-SN3 is configured in the third three-state stage 407. The second three-state stage 405 still includes two pairs of data inverter elements, i.e., p-type and n-type CMOS devices MP2 and MN2, and MPP and MNN having signal paths connected in series with each other and in series with the clock switch elements SP3 and SN3 via the nodes "cnp" and "cpn" to share the second clock switch with the third three-state stage 407. The control electrodes (gates) of MP2 and MN2 are both connected to receive the data input signals of the second three-state inverter stage 405 (the data output of the first feedback stage INV1). That is, MP2 and MN2 are gated by the data input of the second three-state stage 405. The control electrodes (gates) of MPP and MNN are both connected to receive the data output signals of the slave latch 402. Different from the second three-state stage 305 as shown in FIG. 3, the positions of MP2 and MPP are exchanged, and the positions of MN2 and MNN are exchanged. That is, the source of MPP, rather than that of MP2 is directly connected to the node "cnp", and the source of MNN, rather than that of MN2 is directly connected to the mode "cpn."

The data signal outputs of the first and fourth three-state stages 403 and 409 are functions of their respective data inputs when the clock signals C and CN are respectively de-asserted and asserted. While, the data signal outputs of the second and third three-state stages 405 and 407 are functions of their respective data inputs when the clock signals C and CN are respectively asserted and de-asserted. As the same as the flip-flop 300 shown in FIG. 3, since MPP, MP2, MN2, and MNN function as a feedback inverter when the value "pm" at the node 422 is different from the value "ss" at the node 426, the conducting path between nodes 422 and 426 is broken as a result of the different gating signals of MPP and MP2 (either MPP or MP2 are OFF) and different gating signals of MNN and MN2 (either MNN or MN2 are OFF). Then the flip-flop 400 effectively avoids the logic contention too.

In the example of flip-flops 300 and 400, the first clock switch is shared between the first and fourth three-state stages 303, 403, 309, and 409, and the second clock switch is shared between the second and third three-state stages 305, 405, 307, and 407. Though two data elements MPP and MNN are added, four clock switch elements are eliminated. Thus, two semiconductor devices in total are eliminated in each flip-flop. This 50% reduction in the number of clock switches correlates to about a 50% reduction in clock load and power consumption by the clock network compared with conventional flip-flops. Also, the internal clock buffers can be reduced by 50% and hence a 50% reduction to the external clock tree. The flip-flops of the present invention may also reduce the load that the clock switches and associated wiring present to the clock source and reduce the semiconductor area of the IC. The reduction in the number of clock switch elements and in clock power consumption can readily be applied to different flip-flop applications, without compromise in the form of design flow complexity, cycle time, die size overhead, or difficulties in time closure.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner.

Likewise, single connections carrying multiple signals may be separated into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "de-assert" are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The invention claimed is:

1. A flip-flop, comprising:
    a master latch having first and second three-state stages respectively having a first pair of complementary semiconductor devices gated by a data input of the first three-state stage and a second pair of complementary semiconductor devices gated by a data input of the second three-state stage, and a first feedback stage for positive feedback from data outputs of the first and second three-state stages to the data input of the second three-state stage; and
    a slave latch connected to the master latch, and having third and fourth three-state stages, the third and fourth three-state stages respectively having a third pair of complementary semiconductor devices gated by a data input of the third three-state stage and a fourth pair of complementary semiconductor devices gated by a data input of the fourth three-state stage, and a second feedback stage for positive feedback from data outputs of the third and fourth three-state stages to the data input of the fourth three-state stage,
    wherein a first clock switch that receives clock signals from a clock signal source is configured in one of the first and fourth three-state stages, and the other one of the first and fourth three-state stages shares the first clock switch, and a second clock switch that receives clock signals from the clock signal source is configured in one of the second and third three-state stages, and the other one of the second and third three-state stages shares the second clock switch, and the first and second clock switches have opposite phases, and
    wherein the second three-state stage further includes an additional pair of complementary semiconductor devices having signal paths connected in series with each other and both being gated by a data output of the slave latch.

2. The flip-flop of claim 1, wherein the first, second, third and fourth pairs of complementary semiconductor devices have respective signal paths connected in series with each other and in series with one of the first and second clock switches, and the additional pair of complementary semiconductor devices have signal paths connected in series with the second pair of complementary semiconductor devices.

3. The flip-flop of claim 2, wherein positions of a PMOS of the second pair of complementary semiconductor devices and that of the additional pair of complementary semiconductor devices are exchangeable, and positions of a NMOS of the second pair of complementary semiconductor devices and that of the additional pair of complementary semiconductor devices are exchangeable.

4. The flip-flop of claim 1, wherein the first clock switch is configured in the first three-state stage, and the second clock switch is configured in the second three-state stage.

5. The flip-flop of claim 1, wherein the first clock switch is configured in the first three-state stage, and the second clock switch is configured in the third three-state stage.

6. The flip-flop of claim 1, wherein the first clock switch is configured in the fourth three-state stage, and the second clock switch is configured in the second three-state stage.

7. The flip-flop of claim 1, wherein the first clock switch is configured in the fourth three-state stage, and the second clock switch is configured in the third three-state stage.

8. The flip-flop of claim 1, wherein the first and second clock switches are respectively connected to a power supply.

9. A method of operating a flip-flop, said flip-flop comprising a master latch having first and second three-state stages respectively having a first pair of complementary semiconductor devices gated by a data input of said first three-state stage and a second pair of complementary semiconductor devices gated by a data input of said second three-state stage, and a first feedback stage for positive feedback from data outputs of said first and second three-state stages to said data input of said second three-state stage, and a slave latch connected to said master latch, said slave latch having third and fourth three-state stages having respectively a third pair of complementary semiconductor devices gated by a data input of said third three-state stage and a fourth pair of complementary semiconductor devices gated by a data input of said fourth three-state stage, and a second feedback stage for positive feedback from data outputs of said third and fourth three-state stages to said data input of said fourth three-state stage, the method comprising:
    applying a data input signal to said data input of said first three-state stage;
    applying a clock input signal to first and second clock switches, wherein the first clock switch that receives clock signals from a clock signal source is configured in one of said first and fourth three-state stages, and the other one of said first and fourth three-state stages shares the first clock switch, and a second clock switch that receives clock signals from said clock signal source is configured in one of said second and third three-state stages, and the other of said second and third three-state stage shares the second clock switch, wherein the first and second clock switches have opposite phases, and wherein the second three-state stage further includes an additional pair of complementary semiconductor devices having signal paths connected in series with each other and both being gated by a data output of said slave latch.

10. The method of claim 9, wherein said first, second, third and fourth pair of complementary semiconductor devices have respective signal paths connected in series with each other and in series with one of said first and second clock switches, and said additional pair of complementary semiconductor devices have signal paths connected in series with the second pair of complementary semiconductor devices.

11. The method of claim 10, wherein positions of a PMOS of the second pair of complementary semiconductor devices and that of the additional pair of complementary semiconductor devices are exchangeable, and positions of a NMOS of the second pair of complementary semiconductor devices and that of the additional pair of complementary semiconductor devices are exchangeable.

12. The method of claim 9, wherein said first clock switch is configured in said first three-state stage, and the second clock switch is configured in said second three-state stage.

13. The method of claim 9, wherein said first clock switch is configured in said first three-state stage, and the second clock switch is configured in said third three-state stage.

14. The method of claim 9, wherein said first clock switch is configured in said fourth three-state stage, and the second clock switch is configured in said second three-state stage.

15. The method of claim 9, wherein said first clock switch is configured in said fourth three-state stage, and the second clock switch is configured in said third three-state stage.

16. The method of claim 9, wherein said first and second clock switch are respectively connected to a power supply.

* * * * *